United States Patent
List et al.

(10) Patent No.: US 6,888,716 B2
(45) Date of Patent: May 3, 2005

(54) ON-DIE DE-COUPLING CAPACITOR USING BUMPS OR BARS

(75) Inventors: Richard Scott List, Beaverton, OR (US); Bruce A. Block, Portland, OR (US); Mark T. Bohr, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/767,559

(22) Filed: Jan. 28, 2004

(65) Prior Publication Data

US 2004/0184217 A1 Sep. 23, 2004

Related U.S. Application Data

(62) Division of application No. 09/895,362, filed on Jun. 29, 2001, now Pat. No. 6,706,584.

(51) Int. Cl.[7] .......................................... H01G 4/228
(52) U.S. Cl. ..................... 361/306.2; 302/306.1; 302/301.4; 302/307; 302/321.1; 302/321.5; 438/240; 438/250; 438/253; 438/256; 257/532; 257/295; 257/296
(58) Field of Search ............................. 361/306.2, 302, 361/303, 301.4, 306.1, 321.1, 321.2, 311, 313, 321; 438/240, 250, 253; 257/295–296

(56) References Cited

U.S. PATENT DOCUMENTS

| | | | |
|---|---|---|---|
| 5,872,696 A | 2/1999 | Peters et al. | |
| 5,872,697 A | 2/1999 | Christensen et al. | |
| 6,069,051 A | 5/2000 | Nguyen et al. | |
| 6,090,633 A | 7/2000 | Yu et al. | |
| 6,285,070 B1 | 9/2001 | Corisis et al. | |
| 6,423,554 B2 * | 7/2002 | Yang et al. | 438/3 |
| 6,525,427 B1 | 2/2003 | Duncombe et al. | |
| 6,627,968 B2 * | 9/2003 | Cheng et al. | 257/529 |
| 6,727,140 B2 * | 4/2004 | Basceri et al. | 438/240 |
| 6,791,133 B2 * | 9/2004 | Farooq et al. | 257/296 |
| 6,800,921 B1 * | 10/2004 | Coolbaugh et al. | 257/532 |
| 6,812,088 B1 * | 11/2004 | Chen et al. | 438/240 |

* cited by examiner

Primary Examiner—Anthony Dinkins
Assistant Examiner—Nguyen T. Ha
(74) Attorney, Agent, or Firm—Blakely, Sokoloff, Taylor & Zafman LLP (57) ABSTRACT

A method of fabricating an on-chip decoupling capacitor which helps prevent L di/dt voltage droop on the power grid for high surge current conditions is disclosed. Inclusion of the decoupling capacitor on die directly between the power grid greatly reduces the inductance L, and provides decoupling to reduce the highest possible frequency noise. This invention specifically describes the process flow in which the decoupling capacitor is located between the top layer metallization and the standard bump contacts which have either multiple openings or bar geometries to provide both power grid and top decoupling capacitor electrode contacts.

26 Claims, 7 Drawing Sheets

ON-DIE DE-COUPLING CAPACITOR USING BUMPS OR BARS

BACKGROUND

This application is a divisional of U.S. patent application Ser. No. 09/895,362, filed Jun. 29, 2001, now U.S. Pat. No. 6,706,584.

FIELD OF THE INVENTION

This invention relates to integrated circuit decoupling capacitors. More specifically, a decoupling capacitor stack that can be inserted between the top metal layer and a bump metal layer in the back end chip interconnection.

BACKGROUND

The operation of low power, high speed integrated circuits can be affected by the electrical noise generated by the continuous switching of the transistors located in the circuit. It is well known that the inductive noise of an integrated circuit can be reduced by connecting decoupling capacitors to the circuit. Decoupling capacitors placed on power-consuming circuits are able to smooth out voltage variations with the stored charge on the decoupling capacitor. The stored charge is used as a local power supply to device inputs during signal switching stages, allowing the decoupling capacitor to mitigate the effects of voltage noise induced into the system by parasitic inductance.

Typically, a decoupling capacitor is placed in the same package as the chip. Unfortunately, this arrangement is costly to manufacturer, and the long lead lines from the power-consuming circuit to the capacitor electrodes contributes a substantial inductance. Such off-chip decoupling capacitors, however, are not sufficient for very high speed microprocessor applications. The voltage drop across an inductor is L di/dt, where L is inductance and di/dt represents the change in current through a circuit over a period of time. Implicit in the di/dt is a frequency term omega, so as frequency goes up, inductance becomes more and more a factor for power distribution. The frequency dependent Ldi/dt voltage drop makes the off-chip capacitors unusable with gigahertz switching circuits unlike low frequencies for which voltage drops are dominated by resistance.

Some efforts have been made to integrate decoupling capacitors as part of the gate dielectric processing step. A portion of the active silicon area is used to deposit the gate dielectric for use as a decoupling capacitor. An advantage to this is that there are no additional processing steps involved with it. The disadvantages include this decoupling capacitor takes up high-value real estate on the chip as the capacitors compete for valuable die area that could be used for building additional circuits. Also the capacitor made with a gate oxide designed for very high transistor performance has a great deal of leakage. These gate decoupling capacitors also have associated parasitic resistance from the relatively low Si conductivity which entail an additional RC time constant for charge extraction. Although it is possible to integrate gate capacitors within the chip's circuit elements, due to the limited area in which to build these capacitors, the overall capacitive decoupling that they provide is also limited.

Another approach to decoupling capacitor fabrication is a decoupling capacitor that may be fabricated between the metal 6 (n-1) layer and the metal layer 7 (n) in an integrated circuit. The advantage to this embodiment is there is no additional real estate on the chip taken up for fabrication of the decoupling capacitor, and the decoupling capacitor directly bridges the on-die power grid being between 0 and 10 microns from the integrated circuit element it is supporting with a very low inductance per unit length due to the tight spacing of the power and ground lines. An off-chip decoupling capacitors are typically over a millimeter in distance from the circuit element it is supporting with a larger power to ground separation, with higher inductance per unit length. One problem with this technique is that only approximately 30 percent of the metal 6 layer is devoted to power supply. This limits the total amount of decoupling capacitance that can be provided on-die per layer.

BRIEF DESCRIPTION OF THE DRAWINGS

The invention is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

A method of fabricating an on-chip decoupling capacitor which helps prevent L di/dt voltage droop on the power grip for high surge current conditions is disclosed. Inclusion of a decoupling capacitor on-die directly between the power grid greatly reduces the inductance, L, and provides decoupling to reduce the highest possible frequency noise.

In the following description, for the purposes of explanation, numerous specific details are set forth in order to provide a thorough understanding of the claims. It will be apparent, however, to one of ordinary skill in the art, that the present claims may be practiced without some of these specific details. The following description and accompanying drawings provide various examples for the purpose of illustration. However, these examples should not be construed in a limiting sense, as they are merely intended to provide examples of the claims rather than to provide an exhaustive list of all possible implementations of the claims.

Reference will now be made to drawings wherein like structures will be provided with like reference designations. In order to show the structures of the claims more clearly, the drawings included herein are diagrammatic representations of integrated circuit structures. Thus, the actual appearance of the fabricated structures, for example in a photomicrograph, may appear different while still incorporating essential structures of the claims. Moreover, the drawings show only the structures necessary to understand the claims. Additional structures known in the art have not been included to maintain the clarity of the drawings.

Figure 1:
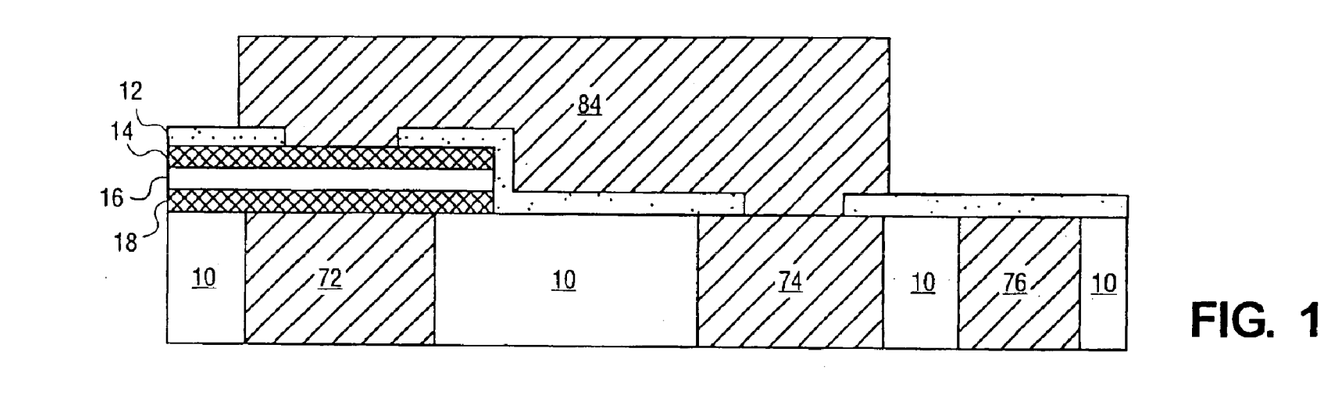
FIG. 1 is a cross-sectional schematic illustration of one embodiment of a bump connection to a decoupling capacitor.

FIG. 1 is an illustration of one embodiment of a bump connection to a decoupling capacitor. FIG. 1 shows the end result of a bump process performed on a metal layer 7 wherein the metal layer 7 includes decoupling capacitors. Metal layer 7 has three kinds of lines on it. The decoupling capacitor is fabricated on the metal 7 $V_{cc}$ line 72. Bump metal connects to metal 7 $V_{cc}$ line 72 through the decoupling capacitor top electrode 14 decoupling $V_{cc}$ line 72. $V_{ss}$ line 74 is coupled directly to bump 84. Metal layer 7 also includes a signal line 76. Between all of these metal lines is the interlayer dielectric 10. The interlayer dielectric can be, but is not limited to, a Plasma Tetra Ethyl Ortho Silicate (PTEOS) oxide. The decoupling capacitor comprising layers 18, 16, and 14 separates metal 7 $V_{cc}$ line 72 from bump metallization 84. Layer 18 is an optional bottom electrode fabricated on the top of metal layer 7. Layer 16 is the high K dielectric material placed on top of the bottom electrode and layer 14 is the top electrode placed on top of the high K dielectric layer 16. A passivation layer 12 is deposited over the decoupling capacitor stack and metal layer 7. In one embodiment, this passivation layer can be silicon nitride. Openings are patterned in the passivation layer to allow an electrical contact to be made to the metal 7 lines. In this figure, bump 84 can be seen to make a direct contact to metal layer 7 $V_{ss}$ line 74, and a decoupling capacitor connection to metal layer 7 $V_{cc}$ line 72. Thus bump 84 is a power connection for $V_{ss}$.

One advantage to the embodiment illustrated in FIG. 1 is there is no additional real estate on the chip taken up for fabrication of the decoupling capacitor, and the decoupling capacitor is no more than 70 microns from the integrated circuit element it is supporting. An off-chip decoupling capacitors are typically a millimeter in distance from the circuit element it is supporting. Metal layer 7 typically has about 60% of its area dedicated to supplying power, and in some cases may have as much as 90% of its area dedicated to supplying power. Lower metal layers, for example layer 2 through 6, dedicate only about 30% of their area to supplying power. Thus the area available for decoupling capacitors on metal layer 7 may be two to three times the area available on metal layer 6, with essentially the same process cost.

Figure 2:
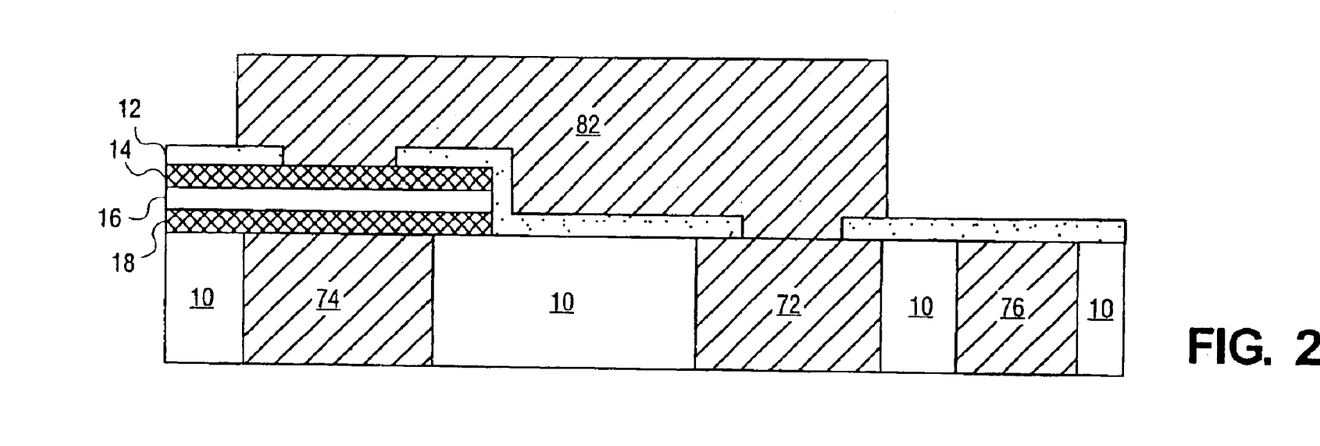
FIG. 2 is a cross-sectional schematic illustration of one embodiment of a bump connection to a decoupling capacitor.

FIG. 2 shows a embodiment of FIG. 1 wherein bump 82 makes direct contact with metal layer 7 $V_{cc}$ line 72, and decoupling contact with metal 7 $V_{ss}$ line 74. Thus bump 82 is a power connection for $V_{cc}$.

Figure 3A:
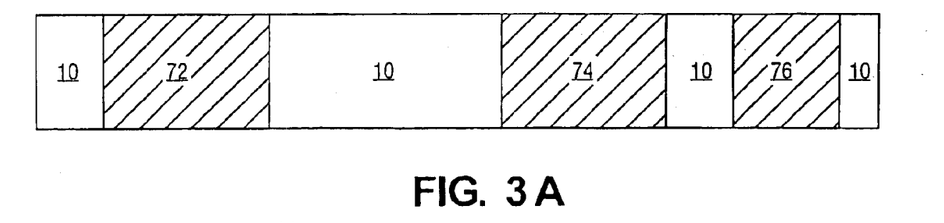
FIG. 3A is a cross-sectional schematic illustration of one embodiment of a planarized metal layer 7.

FIG. 3A shows one embodiment of a method for fabricating the decoupling capacitor stack with a bump. Metal layer 7 comprising the $V_{cc}$ 72, $V_{ss}$ line 74, and signal line 76 along with the interlayer dielectric 10 is planarized using standard damascene process.

Figure 3B:
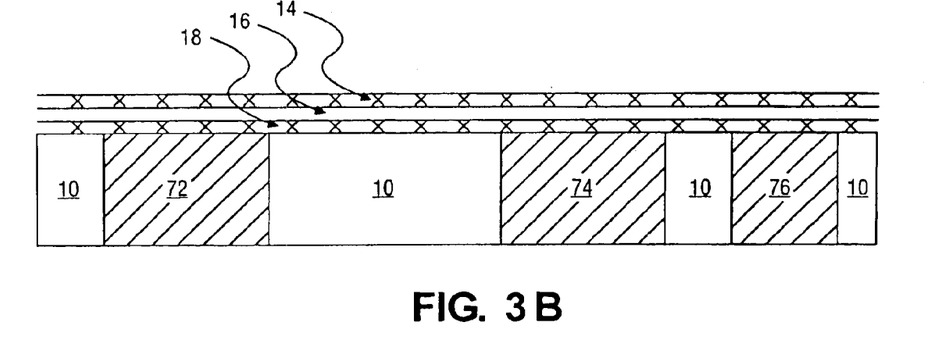
FIG. 3B is a cross-sectional schematic illustration of one embodiment of blanket capacitor stack depositions.

FIG. 3B shows the blanket deposition of the decoupling capacitor stack layers including the optional bottom electrode layer 18, the high K dielectric material layer 16, and the top electrode layer 14. A typical bottom electrode material can be, but is not limited to, tantalum nitride, titanium nitride, and tungsten nitride. The bottom electrode layer 18 typically includes a electrically conductive diffusion barrier to copper preventing the metal layer 7 copper from diffusing up through the high K dielectric during later processing steps. Layer 18 also prevents any chemical reactions between the copper and high K dielectric layer. If the high K dielectric layer is both a copper diffusion barrier and unreactive with copper, i.e. SiN, then the bottom electrode is not required. Bottom electrode layer 18 can also include an oxygen diffusion barrier which will help prevent oxidation of the copper metal line beneath the bottom electrode during subsequent processing steps. In some instances, the oxidation diffusion barrier and the copper diffusion barrier can be the same material or they may be combined into one film. High K dielectric layer 16 is next deposited on the bottom electrode layer 18. Typically, the high K dielectric material comprises tantalum pentoxide ($Ta_2O_5$). However, the high K material can also be barium strontium titanate (BST) or silicon nitride or other materials. In the instance where BST film is used as the high K dielectric material, the electrodes must be made of metals which do not oxidize or if they do oxidize, the oxide is conductive. Platinum, ruthenium and iridium are the most common materials for electrodes to a BST stack capacitor. Next, top electrode 14 is blanket deposited on the high K dielectric material 16. Top electrode 14 material may be, but is not limited to, tantalum nitride, tungsten nitride, and titanium nitride. Top electrode 14 should be a material which does not oxidize during further process steps. Top electrode 14 should also present a conductive barrier to copper for further process steps. The oxidation and diffusion properties of top electrode layer 14 may be combined into one film. The electrical resistivity of layer 14 should also be minimized to reduce RC delays in extracting the charge.

Figure 3C:
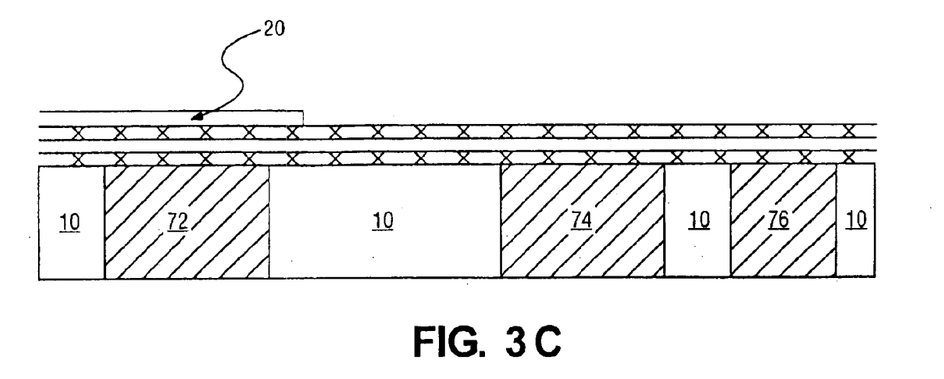
FIG. 3C is a cross-sectional schematic illustration of one embodiment of the capacitor stack depositions of FIG. 3B patterned with photoresist.

FIG. 3C illustrates the spinning and patterning of photoresist 20 on top of the blanket decoupling capacitor stack above metal layer 7. The capacitor stack is patterned with photoresist in areas where it is desired to retain the decoupling capacitor. In FIG. 3C, the photoresist is remaining over $V_{cc}$ line 72. However, other areas of the die, for example $V_{ss}$ 74 and the signal line 76, will not be covered by photoresist. In this figure, it is desired to have the decoupling capacitor between $V_{cc}$ 72 and metal bump 82 (not shown) while forming a direct connection between $V_{ss}$ 74 and the aforementioned bump metal 82.

Figure 3D:
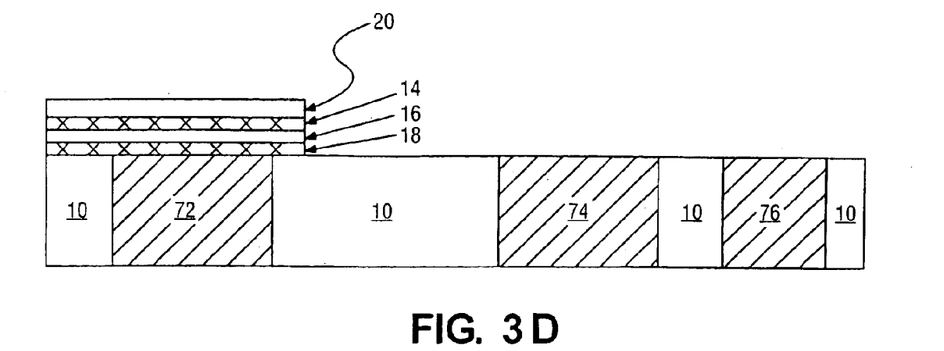
FIG. 3D is a cross-sectional schematic illustration of one embodiment of the capacitor stack after etch of stack layers.

FIG. 3D illustrates the process step after the blanket decoupling capacitor stack has been etched away except in those places where it is desired to retain the decoupling capacitor stack. Photoresist layer 20 has acted as an etch mask over what is left of the decoupling capacitor stack layers. The process step has etched through the capacitor stack stopping on the planarized copper and interlayer dielectric metal layer 7.

Figure 3E:
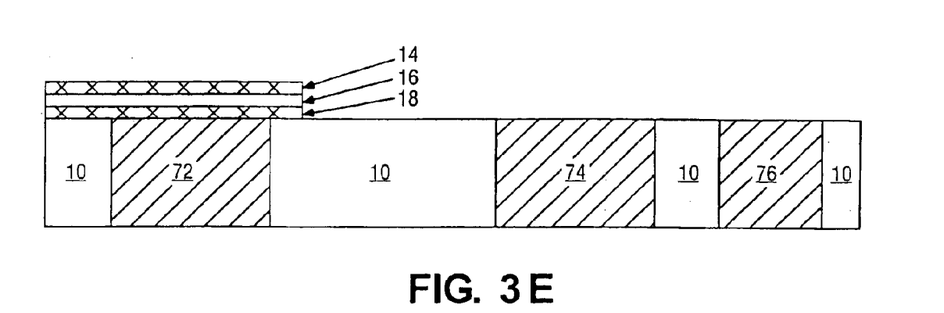
FIG. 3E is a cross-sectional schematic illustration of one embodiment of the capacitor stack of FIG. 3D after removal of the photoresist.

FIG. 3E illustrates the capacitor stack after the photoresist has been chemically stripped using a copper inert chemical. For this flow it is essential to use a copper inert stripping chemical for the photoresist in FIG. 3E because in this illustration, metal layer 7 $V_{ss}$ line 74 and signal line 76 are exposed to the photoresist stripping chemical. Typically metal layer 7 lines are made out of copper. It is also possible to only partially remove the high K/electrode stack during the patterned etch, then use an aggressive strip which sees no exposed copper, then perform a blanket copper friendly etch to finally remove the high K/electrode stack from areas where no decoupling capacitors are desired with a reduced top electrode thickness for the remaining decoupling capacitors.

Figure 3F:
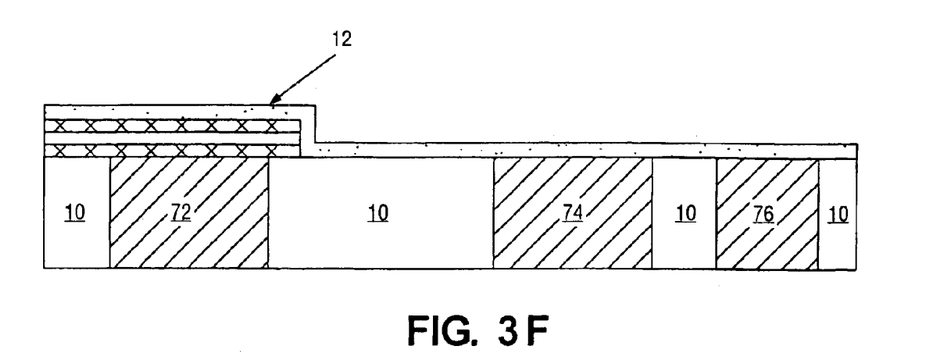
FIG. 3F is a cross-sectional schematic illustration of one embodiment of metal layer 7 and capacitor stack of FIG. 3E after deposition of a passivation layer.

FIG. 3F illustrates the application of a thin passivation layer covering metal layer 7 and the decoupling stack capacitor. In one embodiment, the thin passivation layer may be a silicon nitride layer.

Figure 3G:
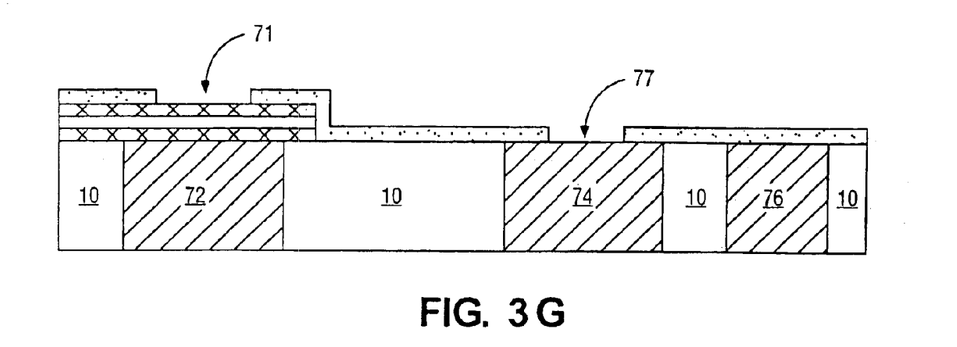
FIG. 3G is a cross-sectional schematic illustration of one embodiment of the metal layer 7 and capacitor stack of FIG. 3F after patterning and fabrication of openings in the passivation layer for contact to the decoupling capacitor and metal layer 7.

In FIG. 3G, the passivation material has been patterned and openings have been fabricated in the passivation layer to allow contact to the metal layer 7 lines where contact is desired. The opening in the passivation layer in this illustration for contact to the top electrode of the decoupling capacitor stack 71 is designed to allow a $V_{ss}$ metallization bump to contact the top electrode of the stack enabling decoupling of the metallization bump and metal layer 7 $V_{cc}$ line 72. Passivation opening 77 over metal layer 7 $V_{ss}$ line 74 is designed to allow a direct connection between the metal layer 7 $V_{ss}$ line 74 and the $V_{ss}$ metallization bump 84 (not shown).

Figure 3H:
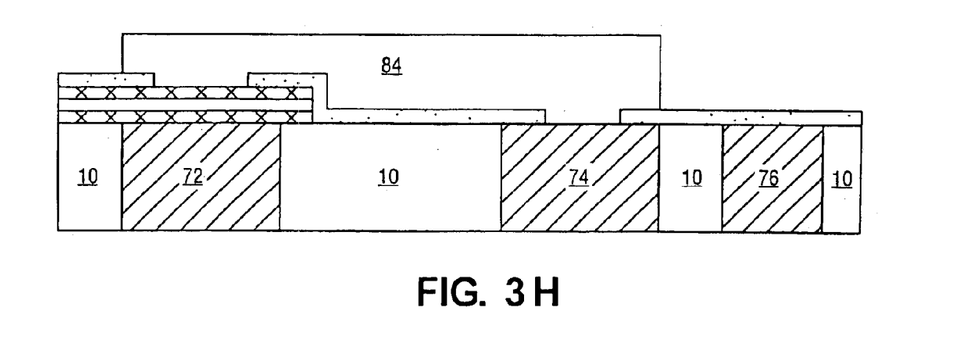
FIG. 3H is a cross-sectional schematic illustration of one embodiment of a bump contacting metal layer 7.

FIG. 3H is an illustration demonstrating metallization bump 84 contacting both the top electrode to the decoupling capacitor stack on metal layer 7 $V_{cc}$ line 72 and making a direct contact to metal layer 7 $V_{ss}$ line 74.

Figure 4:
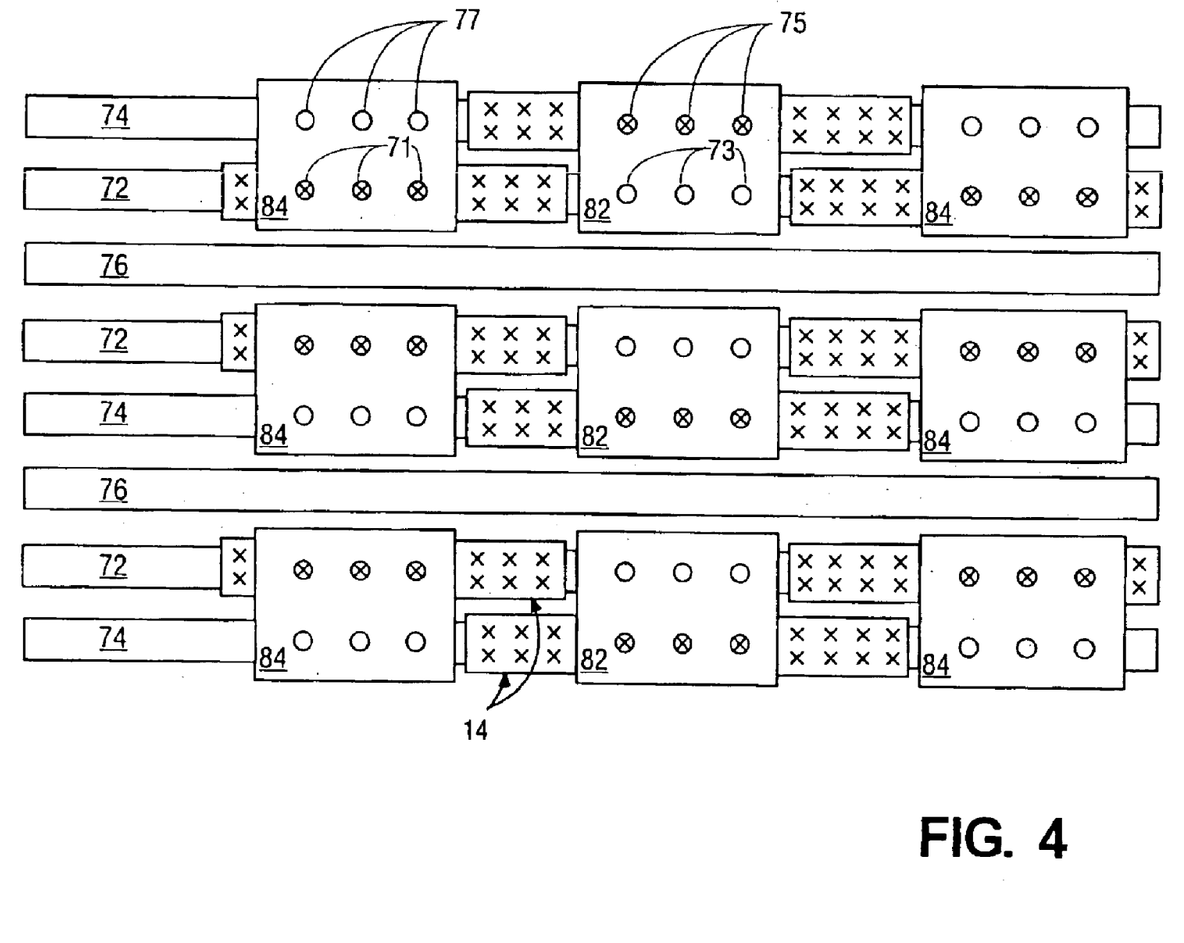
FIG. 4 is a schematic top view illustration of one embodiment of bumps contacting metal layer 7.

FIG. 4 is a schematic top view of one embodiment of bumps contacting metal layer 7. FIG. 4 shows a small section of the area of the chip. This small section shows a part of 8 metal lines of which there are numerous multiple more on the same metal layer. In this illustration, all metal lines labeled 74 are $V_{ss}$ metal lines. All metal lines labeled 72 are $V_{cc}$ metal layer 7 lines and all lines labeled 76 are metal layer 7 signal lines. The illustration in FIG. 4 shows 9 metallization bumps. The bumps labeled 84 are designed to make a direct connection to metal layer 7 $V_{ss}$ lines 74 and make decoupling capacitor connections to metal layer 7 lines $V_{cc}$ 72. The direct connection between $V_{ss}$ 84 and metal layer 7 $V_{ss}$ line 74 is made through openings in the not shown passivation layer 12. The decoupling connection between $V_{ss}$ metal bump 84 and metal layer 7 $V_{cc}$ line 72 is made through openings in the not shown passivation layer 12. These openings connect to the top electrode of the stack decoupling capacitor. In this illustration, the top electrode of the stack capacitor 14 is shown throughout. Likewise, metallization bump $V_{cc}$ 82 is intended to make a direct connection to metal layer 7 line $V_{cc}$ 72 through passivation openings 73. $V_{cc}$ 82 is meant to make a coupled contact to the top electrode of the capacitor stack on metal layer 7 $V_{ss}$ line 74 through passivation openings 75.

These multiple opening bumps combined with the on-die decoupling capacitors provide a factor of two to three increase in decoupling capacitance. It is important to note that only the decoupling capacitor area located between overlapping layers has the fastest time constant. Decoupling capacitors in the wings have an additional parasitic RC delay which can be minimized by increasing the thickness of the top electrode, an option available on top of M7 but not between M6 and M7.

Figure 5:
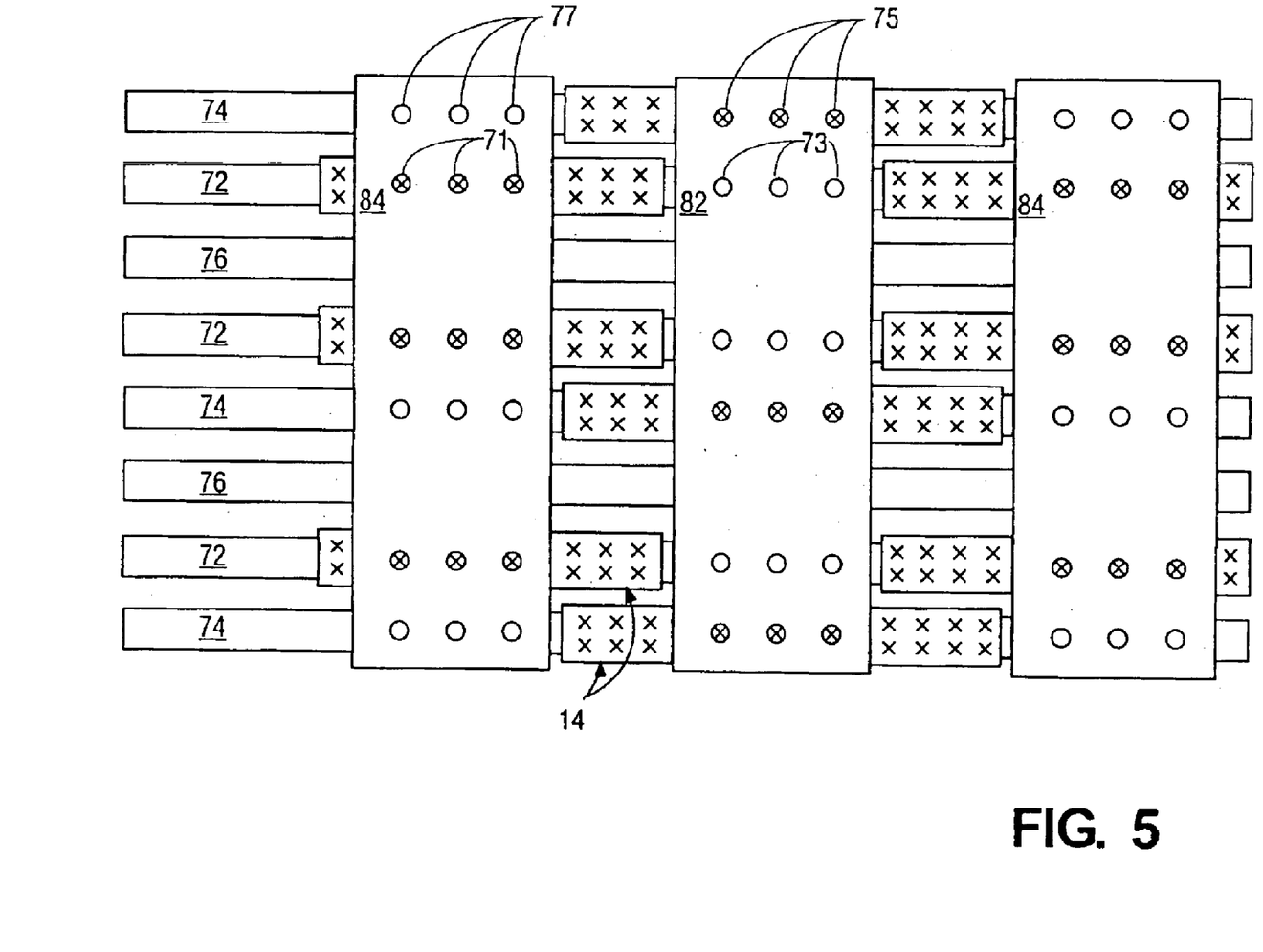
FIG. 5 is a schematic top view illustration of one embodiment of bump bars contacting metal layer 7.

FIG. 5 is a top view schematic of one embodiment of FIG. 4 wherein the metallization bumps are replaced with bars. In this figure, bar 84 is designed to make direct contact with metal layer 7 $V_{ss}$ line 74 through passivation openings 77, and decoupled contact with $V_{cc}$ 72 through passivation openings 71. Bar 82 is designed to make direct contact with metal layer 7 $V_{cc}$ 72 through passivation openings 73, and decoupled contact with $V_{ss}$ 74 through passivation openings 75.

Figure 6:
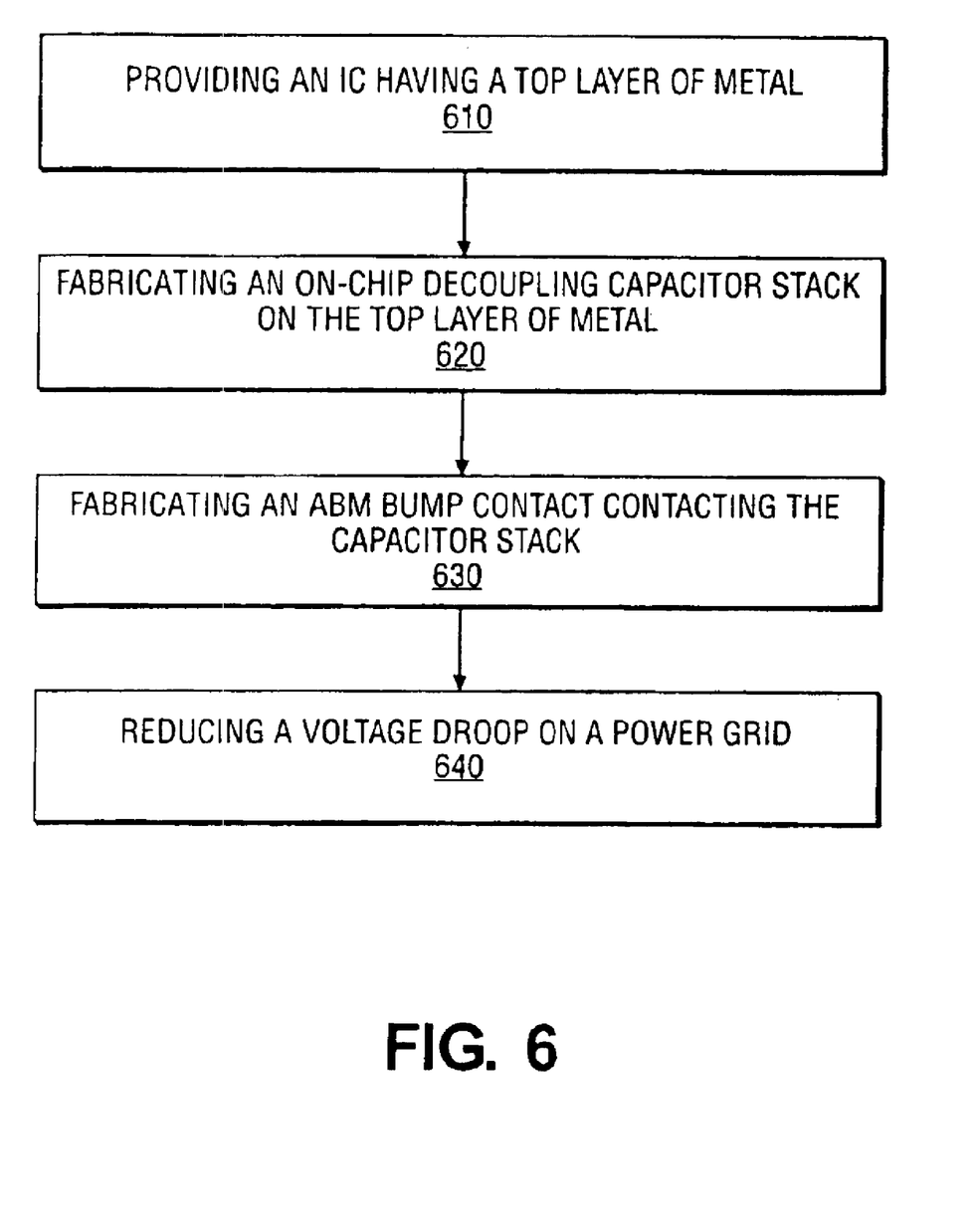
FIG. 6 is a flow diagram representing one method of fabricating one embodiment of the claims.

FIG. 6 is a flow diagram representation of one method of the current claims. At block 610, an integrated circuit having a top layer of metal is provided. This top layer of metal may be a metal layer 7. The metal layer 7 may have 60 percent approximately of its metal lines devoted to power distribution. On-chip decoupling capacitor stacks are fabricated on top of the top layer of metal of the integrated circuit at block 620. These decoupling capacitor stacks fabricated on the top layer of the metal greatly reduce the distance inductance has to build over an off-chip decoupling capacitor, thus reducing the inductance and do not compete for valuable real estate on the die as an 8 capacitor conductor might. A bump contact is fabricated contacting the capacitor stack and metal layer 7 lines at block 630. Moving the decoupling capacitor stacks this close to fill up that portion of the integrated circuits that require power reduces the voltage droop on a power grid as at block 640.

In the preceding detailed description, the invention is described with reference to specific embodiments thereof. It will, however, be evident that various modifications and changes may be made thereto without departing from the broader spirit and scope of the invention as set forth in the claims. Specification and drawings are, accordingly, to be regarded in an illustrative rather than restrictive sense.

What is claimed is:

1. An apparatus comprising:
   a planarized metal interconnect line as the ultimate interconnect layer of an integrated circuit, the planarized metal interconnect line coupled to a bottom electrode of an electrically decoupling capacitor wherein a top electrode of the electrically decoupling capacitor is coupled to a flip chip bump contact such that the capacitor is disposed between and aligned between at least a portion of the metal interconnect line and the bump contact.

2. The apparatus of claim 1, wherein the bump contact contacts the top electrode of the decoupling capacitor through multiple bumps.

3. The apparatus of claim 1, wherein the bottom electrode and the top electrode comprise a material that acts as an oxidation and diffusion barrier.

4. The apparatus of claim 1, wherein a dielectric material having a dielectric constant greater than silicon dioxide comprising the top electrode and the bottom electrode are separated by one of tantalum pentoxide ($Ta_2O_5$), Barium Strontium Titanate (BST) and Silicon Nitride (SiN).

5. The apparatus of claim 4, wherein when the dielectric material is Barium Strontium Titanate the bottom electrode and the top electrode material comprises one of Platinum (Pt), Ruthenium (Ru) and Iridium (Ir).

6. The apparatus of claim 1, wherein the bottom electrode and the top electrode material comprises one of Tantalum Nitrate (TaN), Titanium Nitrate (TiN), Tungsten Nitrate (WN).

7. An apparatus comprising:
   an integrated circuit having a top metal layer interconnect as the ultimate interconnect layer of an integrated circuit, the top metal layer having a plurality of voltage bias lines with a plurality of voltage bias purposes;
   a decoupling capacitor coupled to a first top metal voltage bias line;
   a bump contact coupled to the decoupling capacitor and a second top metal voltage bias line such that the capacitor is disposed between and aligned between at least a portion of the first top metal voltage bias line and the bump contact, the second top metal voltage bias line having a different purpose than the first top metal voltage bias line coupled to the capacitor, wherein the bump contact provides power to the second metal voltage bias line and electrically decouples the first metal voltage bias line from the second metal voltage bias line.

8. The apparatus of claim 7, wherein the decoupling capacitor comprises:

a bottom electrode coupled to a top metal voltage bias line;

a dielectric material having a dielectric constant greater than that of silicon dioxide coupled to the bottom electrode; and a top electrode coupled to the dielectric material.

9. The apparatus of claim 8, wherein the bottom electrode and the top electrode comprise a material that acts as an oxidation and diffusion barrier.

10. The apparatus of claim 8, wherein the dielectric material used in the decoupling capacitor comprises one of tantalum pentoxide ($Ta_2O_5$), Barium Strontium Titanate (BST) and Silicon Nitride (SiN).

11. The apparatus of claim 10 wherein when the dielectric material is Barium Strontium Titanate the bottom electrode and the top electrode material comprises one of Platinum (Pt), Ruthenium (Ru) and Iridium (Ir).

12. The apparatus of claim 7, wherein the bottom electrode and the top electrode material comprises one of Tantalum Nitrate (TaN), Titanium Nitrate (TiN), Tungsten Nitrate (WN).

13. An apparatus comprising:

an integrated circuit having a layer of metal interconnect as the ultimate interconnect layer of the integrated circuit;

a decoupling capacitor stack on the layer of metal interconnect; and a bump contact contacting the capacitor stack such that the capacitor stack is disposed between and aligned between at least a portion of the layer of metal and the bump contact.

14. The apparatus of claim 13, wherein the capacitor stack comprises:

a high coefficient of permittivity material, and a top electrode.

15. The apparatus of claim 14, wherein the capacitor stack further comprises a bottom electrode.

16. The apparatus of claim 15, wherein the bottom electrode and the top electrode comprise a material that acts as a diffusion barrier to the metal layer.

17. The apparatus of claim 16, wherein the bottom electrode and the top electrode comprise a material that acts as a diffusion barrier to oxygen.

18. An apparatus comprising:

an integrated circuit comprising a layer of metal as the ultimate interconnect layer of the integrated circuit, a capacitor stack comprising:

a blanket bottom electrode material on the layer of metal, a dielectric material having a dielectric constant greater than that of silicon dioxide on the blanket bottom electrode material, a blanket top electrode material on the dielectric material, a blanket passivation layer on the stack, and a bump contact contacting the top electrode material such that the top electrode material is disposed between and aligned between at least a portion of the layer of metal and the bump contact.

19. The apparatus of claim 18, wherein the bottom electrode and the top electrode comprise a material that acts as an oxidation barrier.

20. The apparatus of claim 18, wherein the bottom electrode and the top electrode comprise a material that acts as a diffusion barrier.

21. The apparatus of claim 18, wherein the bump contact is in direct physical contact with the top electrode.

22. An apparatus comprising:

an integrated circuit having a layer of metal interconnect as the ultimate interconnect layer of the integrated circuit, wherein the layer of metal comprises a first metal power bias voltage line and a second metal power bias voltage line;

a decoupling capacitor stack on a portion of the first metal power bias voltage line, the decoupling capacitor having a characteristic to reduce a voltage droop on the first metal power bias voltage line;

a passivation layer over a top and a side of the decoupling capacitor stack;

a bump contact contacting the capacitor stack through a removed portion of the passivation layer over the top of the decoupling capacitor stack such that the capacitor stack is disposed between and aligned between at least a portion of the layer of metal and the bump contact, the bump contact also contacting the second metal power bias voltage line.

23. The apparatus of claim 22, wherein the capacitor stack comprises:

a high coefficient of permittivity material, and a top electrode.

24. The apparatus of claim 23, wherein the capacitor stack further comprises a bottom electrode.

25. The apparatus of claim 24, wherein the bottom electrode and the top electrode comprise a material that acts as a diffusion barrier to the metal layer.

26. The apparatus of claim 25, wherein the bottom electrode and the top electrode comprise a material that acts as a diffusion barrier to oxygen.

* * * * *